(12) United States Patent
Marcenac et al.

(10) Patent No.: US 6,188,511 B1
(45) Date of Patent: Feb. 13, 2001

(54) OPTICAL AMPLIFIER

(75) Inventors: Dominique David Marcenac; Derek Nesset; Anthony E. Kelly, all of Ipswich (GB)

(73) Assignee: British Telecommunications, London (GB)

( * ) Notice: Under 35 U.S.C. 154(b), the term of this patent shall be extended for 0 days.

(21) Appl. No.: 08/973,458

(22) PCT Filed: Jun. 7, 1996

(86) PCT No.: PCT/GB96/01376

§ 371 Date: Dec. 5, 1997

§ 102(e) Date: Dec. 5, 1997

(87) PCT Pub. No.: WO96/41405

PCT Pub. Date: Dec. 19, 1996

(30) Foreign Application Priority Data

Jun. 7, 1995 (GB) .................................... 9511515
Jul. 20, 1995 (EP) ................................. 95305060
Apr. 24, 1996 (GB) .................................. 9608421

(51) Int. Cl.$^7$ ............................... H01S 3/00; G02F 1/035
(52) U.S. Cl. ................................. 359/344; 385/2
(58) Field of Search .................................. 359/344; 385/2

(56) References Cited

PUBLICATIONS

Electronics Letters, vol. 31, No. 17, Aug. 17, 1995, p. 1442/1443 XP000528968 Marcenac D D et al: "Bandwidth Enhancement Of Wavelengh Conversion Via Cross–Gain Modulation By Semiconductor Optical Amplifier Cascade" see the whole document.*

IEEE Photonics Technology Letters, vol. 7, No. 6, Jun. 1995, New York US, pp. 617–619, XP002013675 D.A.O. Davies: "Small–signal of wavelength conversion in semiconductor laser amplifiers via gain saturation" cited in the application see the whole document.*

Proceedings Of The European Conference On Optical Communication, Firenze, Sep. 25–29, 1993, pp. 635–641, XP002013676 K.E.Stubkjaer et al.: "Optical wavelength converters" cited in the application see page 637, line 12–line 34; figure 6.*

(List continued on next page.)

*Primary Examiner*—Mark Hellner
(74) *Attorney, Agent, or Firm*—Nixon & Vanderhye P.C.

(57) ABSTRACT

A semiconductor optical amplifier has an optical path from its input to its output through an optical amplification region, the path having a length that exceeds 1 mm. In use, the amplifier is fed at its input with a modulated optical signal that is modulated at a given bit rate, and a target wave, so that the amplifier produces modulation of the target wave according to the modulation of the optical signal. The path length is selected to be longer than that at which optical saturation occurs. The gain of the amplifier exhibits a –3 db bandwidth that extends beyond 20 GHz in respect of the modulation bit rate. The amplifier may also be used for four wave mixing.

30 Claims, 8 Drawing Sheets

OTHER PUBLICATIONS

Electornics Letters, vol.30, No. 9, Apr. 28, 1994, Stevenage GB, pp. 720–721, XP002013677 J.M.Wiesenfeld et al.: "Bit error rate performance for wavelength conversion at 20 Gbit/s" cited in the application, see the whole document.*

Proceedings Of The European Conference On Optical Communication Ec, Montreux, Sep. 12–16, 1993, vol. 3, Sep. 12, 1993, Swiss Electrotechnical Association, pp. 73–76, XP000492291 Mikkelsen B et al: "20 Gbit/s Polarisation Insentive Wavelength Conversion in Semiconductor Optical Amplifiers" see figures 1,2,4.*

IEICE Transactions On Electronics, vol. E77, No. 4, Apr. 1994, Tokyo JP, pp. 624–632, XP000460067 S.El Yumin et al.: "Taper–shape dependence of tapered–waveguide traveling wave semiconductor laser amolifier (TTW–SLA)" cited in the application see paragraph 5; figure 1.*

Applied Physics Letters, vol. 62, No. 6, Feb. 8 1993, pp. 544–546, XP00336659 Mehuys D et al: "11.6 W Peak Power, Diffraction–Limited Diode–To–Diode Optical Amplifier" cited in the application see abstract.*

* cited by examiner

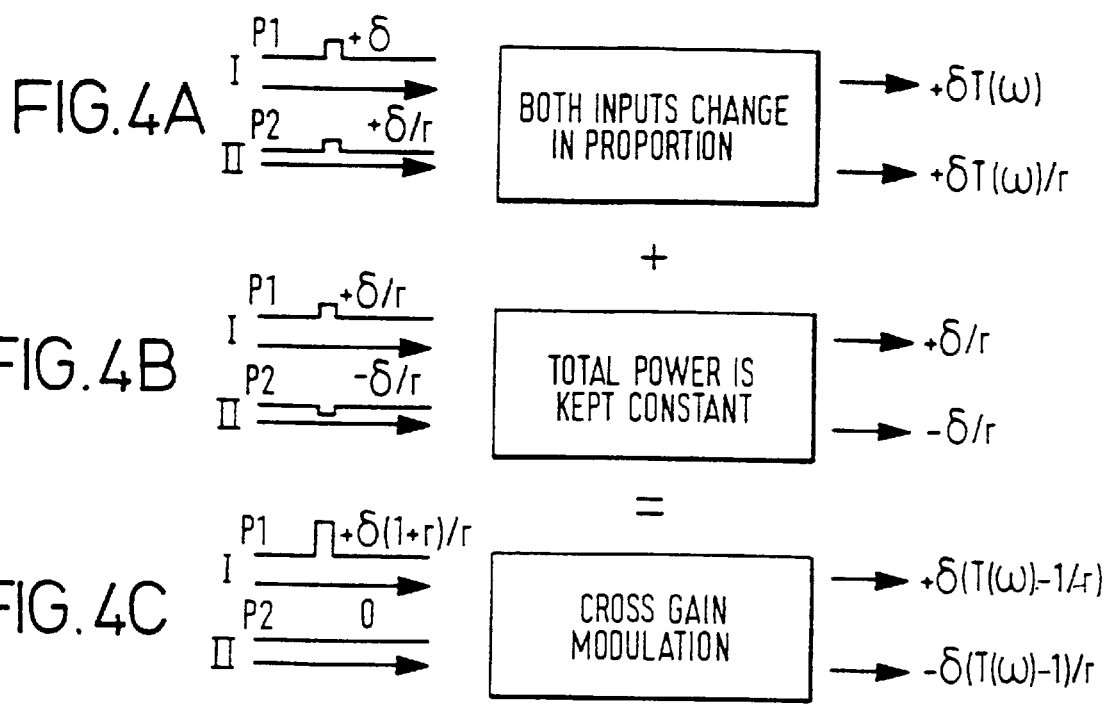
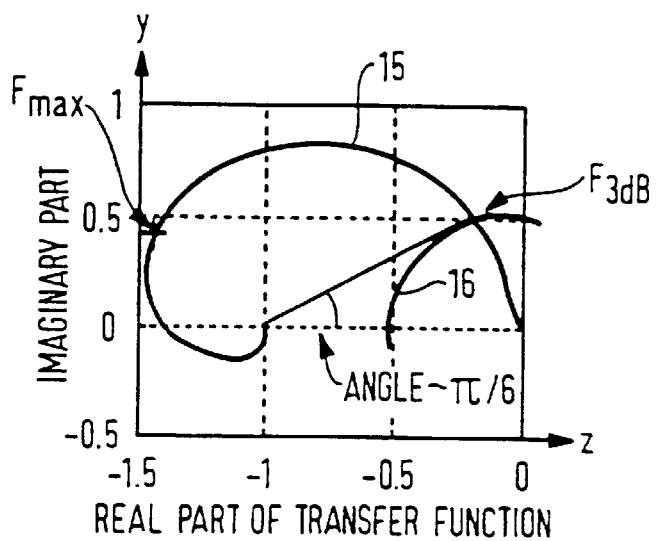
FIG. 5

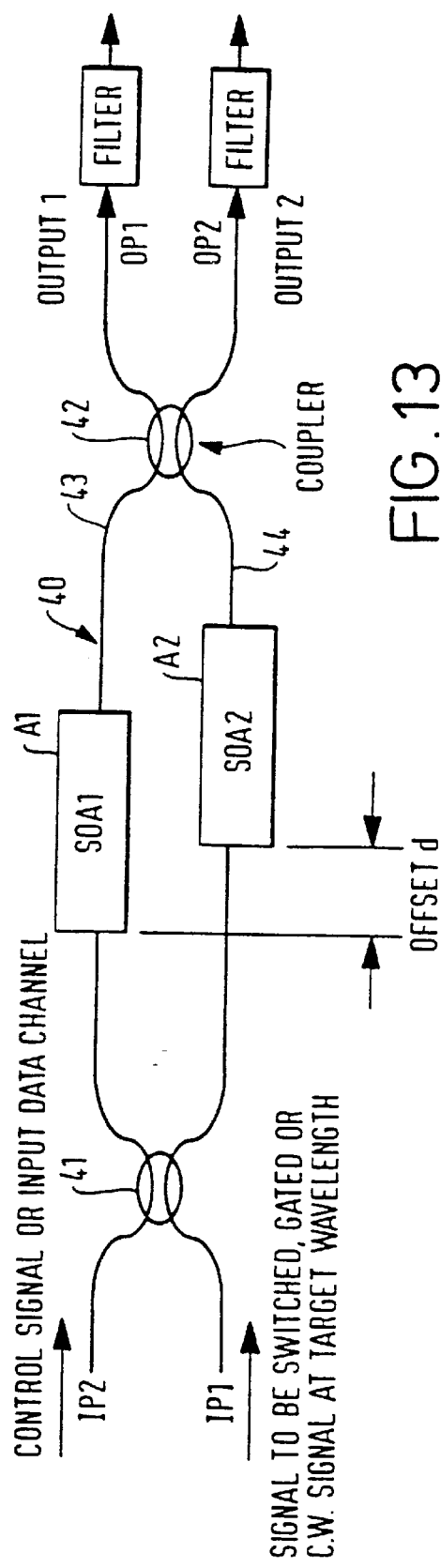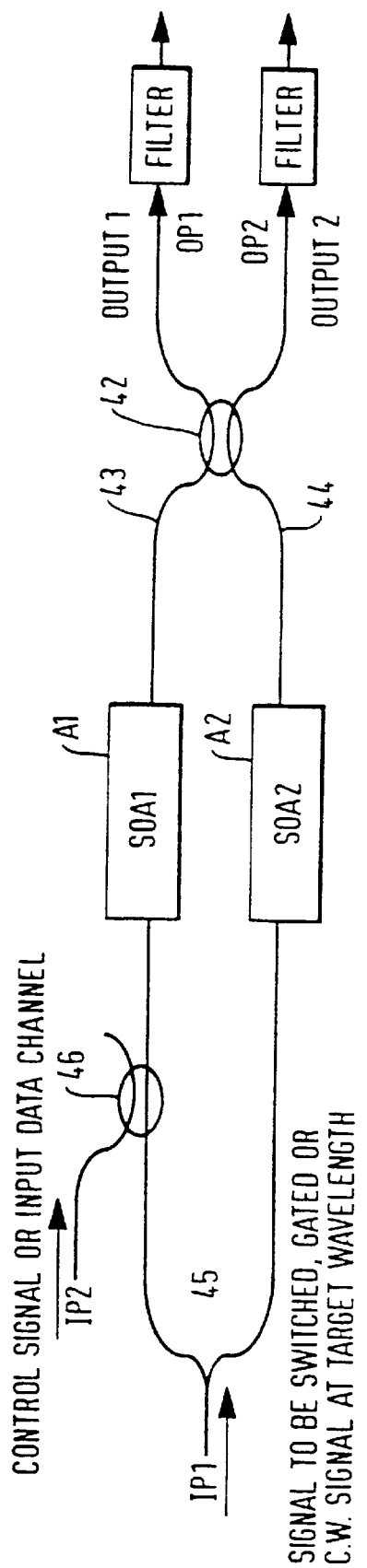

OPTICAL AMPLIFIER

BACKGROUND OF THE INVENTION

1. Field of the Invention

This invention relates to an optical amplifier, particularly a semiconductor optical amplifier having non-linear characteristics.

2. Related Art

It is known that semiconductors can act as optical amplifiers. When certain semiconductors are subject to an injected electric current, an incident photon causes an electron to traverse semiconductor's gap band with the result that an additional photon is generated thereby producing light amplification. Semiconductor optical amplifiers which operate in this way are well known and reference is directed to "Long Wavelength Semiconductor Lasers" G. P. Agrawal and N. K. Dutta; Van Nostrand, Chapters 1 to 6.

The semiconductor material which is used as the active amplification region of the device may comprise a bulk material or for example, a stack of multiple quantum wells (MQW). A problem with the semiconductor material that is used for the amplifications region is that it suffers from a gain-saturation effect which may be produced by amplified spontaneous emission (ASE). For this reason, typical devices that use bulk semiconductor material in a parallel sided channel, usually have a length of 500 microns or less and a width of 1–2 microns, because if the device were to be made longer, there would be no improvement in gain. For MQW devices, the gain per unit length is slightly lower than for bulk material devices, and amplifiers of length up to 1 mm have been produced hitherto but it is has been considered that devices of longer length would suffer from ASE, with no improvement in gain. Longer, tapered devices have been reported, of length 1–3 mm, in which tapering of the amplifier is arranged to offset partially the onset of gain saturation. Reference is directed to S. El Yumin et al, "Taper Shape Dependence of Tapered-Waveguide Travelling Wave Semiconductor Amplifier", IEICE Transactions on Electronics, Vol. e77, No 4, April 1994, Tokyo Japan. Reference is also directed to D. Mehuys et al, "11.6 W Peak power diffraction limited diode-to-diode optical amplifier" Appl. Phy. Lett. Vol. 62, No 6, Feb. 8, 1993, pp 544–546, which discloses a broad area travelling wave amplifier of width 600 $\mu$m and length 2200 $\mu$m.

Another disadvantage of longer devices is that they are harder to mount. Conventionally, SOAs are mounted using headers designed for laser diodes, which tend to be shorter and as a result, it is not straightforward to package longer devices.

Also, longer devices consume more power, so that it has been considered disadvantageous for the device to be longer than that at which optical saturation occurs.

Semiconductor optical amplifier devices can be used for a number of different purposes and a review is given in K. E. Stubkjaer et al, "Optical Wavelength Converters", Proc. ECOC '94, pp 635–642. SOAs can be used as modulators, in which an optical signal, modulated at a given bit rate, is fed into the amplifier, together with a separate target wave. The modulated signal produces gain-saturation for successive bits and as a result, the target wave is modulated with the input bit pattern. This is known as cross gain modulation (XGM). The modulation may also produce a phase shift in the target wave and this is known as cross phase modulation (XPM). Both of these processes may produce wavelength conversion. For example, the target wave source may be at a different wavelength to the modulated input source so that the bit modulation is transferred from the input optical source at a first wavelength to the target wave at a second different wavelength.

In order for the modulator to be effective, for example in an optical data transmission network, it is desirable that the amplifier exhibit uniform amplification characteristics over a wide range of bit modulation frequencies. For example, Stubkjaer supra suggests a bit rate transparency to more than 5–10 G-bit/s. A bit rate of 20 G-bit/s has been reported by J. M. Wiesenfeld, J. S. Perino, A. H. Gnauk and B. Glance, "Bit Error Rate Performance for Wavelength Conversion at 20 G-Bit/S", Electron. Lett. 30, pp 720–721 (1994) although it is not clear from Wiesenfeld et al whether the modulator was operating within a 3 db bandwidth.

Hitherto, it had been considered that the bandwidth was limited by the differential carrier recombination rate in the amplifier, this rate including spontaneous emission and stimulated emission.

However, in accordance with the present invention, it has been found that the −3 db bandwidth of the gain of the amplifier in respect of the bit modulation rate, is a function of the length of the path through the amplifier. Thus, in accordance with the invention, it has been appreciated that by increasing the length of the path, this bandwidth can be increased.

Semiconductor amplifiers can also be used to produce wavelength conversion by a different process known as four wave mixing. This is discussed in Stubkjaer supra and a fuller theoretical discussion is given in "Population pulsations and nondegenerate four-wave mixing in semiconductor lasers and amplifiers" G. P. Agrawal, J. Opt. Soc. Am. B, Vol 5, No 1, January 1988 pp 147–159. In four wave mixing, pump radiation at a pump wavelength $\lambda_p$ is fed into a semiconductor amplifier, together with an input signal $\lambda_i$ of a different wavelength to the pump signal. In a typical example, the pump waveform has an energy of 10 mw whereas the input signal has an energy of 1 mw. The wavelength of the input signal is close to that of the pump, typically with a wavelength difference of $\cong$2 nm. The two beams are of the same polarisation and consequently beat coherently, with a beat frequency in this example of $\cong$100 GHz. The resultant beat waveform causes the carrier density in the amplifier to oscillate. This produces a non-linear effect on the gain, which lags the input waveform and beats with it. It can be shown that this produces a wavelength converted signal $\lambda_c$, with a wavelength $\lambda_c=2\lambda_p-\lambda_i$. The converted signal $\lambda_c$ and the input signal $\lambda_i$ are equally spaced in terms of wavelength above and below the pump wavelength $\lambda_p$.

Four wave mixing has the advantage that the conversion process is extremely fast as it does not rely on carrier recombination as in XGM and XPM. Furthermore, there is less distortion but four wave mixing suffers from the disadvantage that the converted signal is of low power and the signal to noise ratio can be a problem in respect of the converted signal.

However, in accordance with the invention, it has been found that the conversion efficiency for four wave mixing is function of the length of the path through the amplifier. Thus, in accordance with the invention, it has been appreciated that by increasing the length of the path, the four wave mixing efficiency can be increased.

SUMMARY OF THE INVENTION

In accordance with the invention from a first aspect, there is provided a semiconductor optical amplifier apparatus including an optical path from an input to an output through an optical amplification region of substantially constant width of less than 50 μm along its length, the path having a length through the region that exceeds 1 mm.

In another aspect, the invention provide optical apparatus comprising a target wave source, a modulated optical source that is modulated at a given bit rate, and an optical amplifier to receive radiation from the sources and operative to produce modulation of the target wave according to the modulation of the modulated optical source whereby to produce a modulated target wave output, wherein the amplifier has an optical path from an input to an output through an optical amplification region and the length of the path is selected to be longer than that at which optical saturation in said region occurs.

Also, in accordance with the invention there is provided optical modulation apparatus comprising a target wave source, a modulated optical source that is modulated at a given bit rate, an optical amplifier to receive radiation from the sources and operative to produce modulation of the target wave according to the modulation of the modulated optical source whereby to produce an modulated target wave output, wherein the amplifier has an optical path from an input to an output through an optical amplification region and the length of the path is selected so that the gain of the amplifier for the modulated target wave output exhibits a −3 db bandwidth that extends beyond 20 GHz in respect of the modulation bit rate.

The modulated optical source may produce cross gain modulation in the amplifier. Furthermore, cross phase modulation may be produced which may alternatively be used when modulating the target wave. The target wave source may have a different wavelength characteristic from the modulated optical source with the result that wavelength conversion occurs. This may be used to provide an all-optical switch, in which the amplifier is connected to a plurality of optical output channels each with their respective optical filter tuned to a different wavelength, so that, by controlling the wavelength of the target wave source, the modulated output can be directed to the different channels selectively.

The path through the optical amplification region of the amplifier is selected so as to optimise the bandwidth as aforesaid but may be selected not to be sufficiently long as to cause undue problems with ASE. Typically, the path length does not exceed 5 mm. Convenient choices for the path length are that it should exceed 1.0, 1.125, 1.25, 1.5, 1.75, 2.0, 2.2, 2.25, 2.50 or 2.75 mm.

The amplifier may comprise at least first and second amplifier elements connected in cascade, with the aggregate length of the paths through the elements being selected so as to achieve the desired bandwidth.

In practical examples of the invention, the −3 db bandwidth may extend beyond 28, 35 or 40 GHz by suitable choice of device parameters.

The invention is also applicable to four wave mixing and in a further aspect, the invention provides a semiconductor optical amplifier that includes an optical path from an input to an output through an optical amplification region, first and second sources of different optical radiation for the amplifier, whereby the amplifier produces an amplified optical output in dependence upon the optical radiation from the first and second source, wherein the path has a length through the region that exceeds 1 mm.

The first source may comprise a source of pumping radiation for the amplifier at a wavelength $\lambda_p$ and the second source may comprise a signal source at a wavelength $\lambda_i$, such that the amplifier is operative to produce an output by four wave mixing at a wavelength $\lambda_c$, with an improved amplitude and signal to noise ratio than hitherto.

In another aspect, the invention provides semiconductor optical amplifier apparatus including an optical path from an input to an output through an optical amplification region wherein the path has a length L through the region that exceeds 3 mm.

BRIEF DESCRIPTION OF THE DRAWINGS

In order that the invention may be more fully understood examples will now be described with reference to the accompanying drawings in which:

FIGS. 4A–4C are schematic diagrams for explaining XGM effects in the amplifier of FIGS. 1 and 2 by a superposition of SGM effects;

FIG. 5 is a graph of the real and imaginary parts of a function (T(ω)-1);

FIGS. 13 to 15 illustrate alternative examples of how amplifiers according to the invention can be configures in the Mach-Zehnder interferometer.

DETAILED DESCRIPTION OF EXEMPLARY EMBODIMENTS

Figure 1:
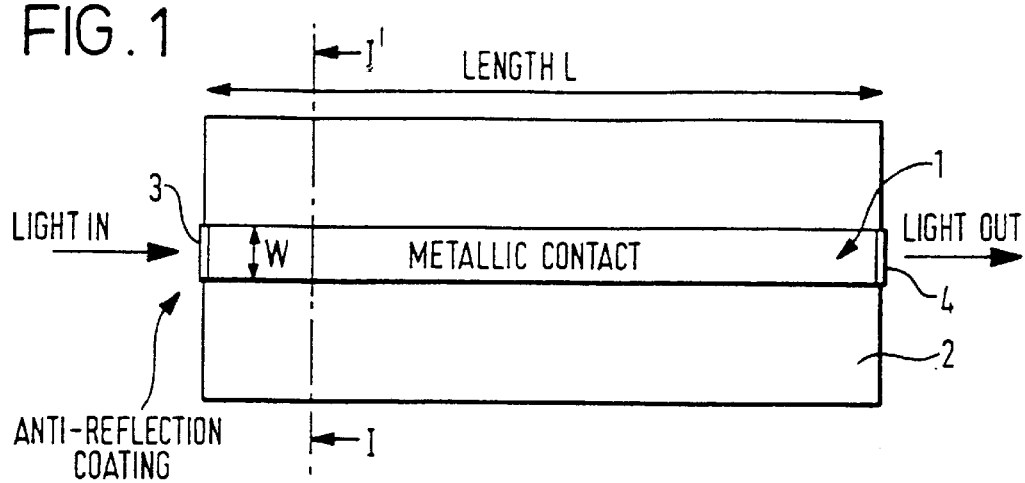
FIG. 1 is a top plan view of a semiconductor optical amplifier.
Figure 2:
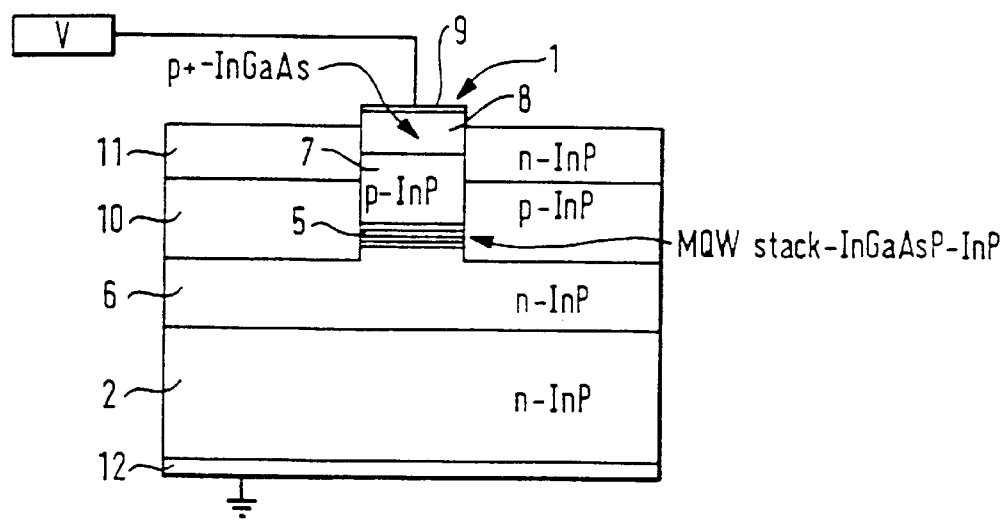
FIG. 2 is a sectional view taken on I-I' of FIG. 1.

A typical semiconductor optical amplifier A1 is shown in FIGS. 1 and 2 which is fabricated in the InGaAsP material system for use in telecommunication systems, with wavelengths centred on 1.55 μm. The device consists of an elongate amplification region 1 formed on a substrate 2. The amplification region 1 has an input 3 at one end for optical radiation and an optical output 4 at the other end each formed with anti-reflection coatings. A typical reflectivity is of the order of $10^{-3}$~$10^{-4}$. The input 3 and output 4 are configured to couple into single mode optical waveguides e.g. optical fibres or alternatively other structures (not shown) integrated onto the substrate. The region 1, as explained hereinafter is elongate with a length L and a and a width W defined by a lateral confinement structure. As will be explained hereinafter, the length L of the amplifier region 1 is selected to be longer than hitherto in order to improve the amplifier characteristics. The width W of the region 1 is selected for guided travelling wave operation and is typically of the order of 1–2 μm, less than 50 μm and usually less than 5 μm.

The active amplification region 1 can be fabricated in a number of different ways and an example that comprises a buried heterostructure is shown in FIGS. 1 and 2. Referring to FIG. 2, the active region 1, which produces amplification, comprises a stack of multiple-quantum-wells comprising a plurality of alternate layers of InGaAsP-InP 5 formed on a n-InP substrate 6. The active region 5 is overlaid by a p-InP region 7 formed with a conductive over-contact 8 formed of p-InGaAsP material, provided with a metallic contact 9. A metallisation layer 12 is formed in the underside of the substrate 2.

When forming the device, regions to the side of the elongate active region 1 are removed by selective etching in a manner known per se and layers 10 and 11 of p-InP and n-InP material are grown back.

Thus, the MQW stack 5 is sandwiched between p-InP region 7 and n-InP layer 6 so that when a voltage is applied between the metallic contact 9 and the metallisation layer 12, an electric current passes through the stack 5. The arrangement of the n and p doped layers 10 and 11 forms a reverse-biased junction so that the current produced by the voltage applied to contact 9 is directed selectively through the active region 1 rather than to each side, to provide lateral confinement. Thus, photons incident on input 3 (FIG. 1) cause electrons to traverse the bandgap of the MQW stack 5 so as to generate additional photons, thereby producing optical amplification. For further details of the structure of the device and various modifications thereof, reference is directed to "Long Wavelength Semiconductor Laser" Agrawal and Dutta, supra, from which it will be appreciated that a bulk device can be used as an alternative.

Figure 3:
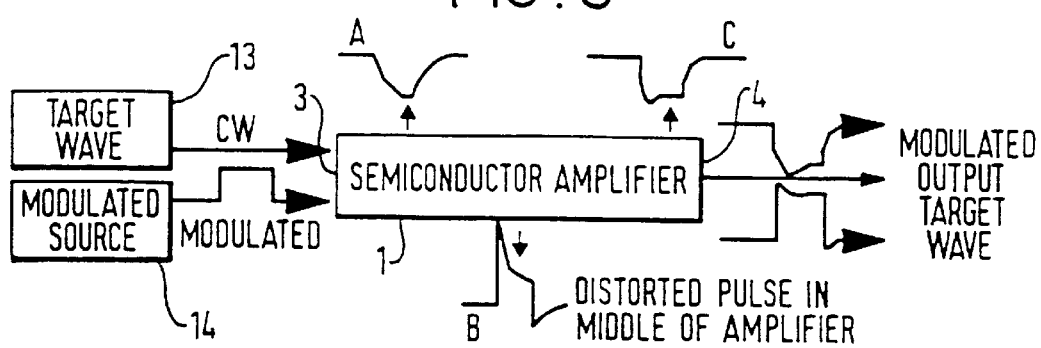
FIG. 3 is a schematic diagram for illustrating modulation effects in the amplifier of FIGS. 1 and 2.

A semiconductor optical amplifier can be used as an active component in a modulator as will be explained with reference to FIG 3. An essentially continuous target wave source 13 e.g. a laser operating in the aforesaid optical telecommunications wavelength band, is directed into the input 3 of the active region 1 of the amplifier. Also, an optical source 14, which has been modulated at a given bit rate is directed to the input 3 of the amplifier. The "1" bits of the modulation produce saturation effects in the active region with a result that the target wave becomes modulated by the signals from the source 14 and the resulting output at output 4 comprises the target wave modulated with the modulation pattern from source 14. The target wave source 13 and the modulated source 14 can operate at different frequencies so that a wavelength conversion takes place. This process is known as cross gain modulation. As previously explained, the modulation may also produce a phase change, which can be detected by comparing the phase of the modulated output target wave with the phase of the input target wave from source 13 (by means not shown).

In order to operate as a practical device, the modulator needs to be able to operate over a wide range of bit rates for the modulated source 14. Thus, the amplifier gain should not vary significantly over the desired operating range of bit rate modulation.

In accordance with the invention, it has been appreciated that this gain bandwidth of the amplifier in respect of the modulation bit rate is a function of the length L of the optical active region shown in FIG. 1. A derivation of the wavelength conversion frequency response will now be given in order to show the length dependency of the bandwidth characteristics. This is carried out by firstly considering the response of the amplifier to a single input beam and then extending the analysis to two input beams by superposition.

Considering firstly the case of a saturated amplifier with a single optical input beam, the carrier density N in the amplifier evolves with time as:

$$\frac{\partial N}{\partial t} = \frac{J}{ed} - R(N) - \frac{a\Gamma(N - N_t)}{Ah\nu} P \qquad (1)$$

where $R(N)$ is the spontaneous recombination rate, J the injected current density, d the active layer thickness, e the electronic charge, A the active cross section, $\Gamma$ the mode confinement, $h\nu$ is the photon energy, a is the material gain, $N_t$ is the transparency carrier density and P is the optical power.

This is known as self gain modulation and a fuller explanation is given in: G. P. Agrawal & N. A. Olsson, "Self-phase modulation and spectral broadening of optical pulses in semiconductor laser amplifiers" J. Quantum Electron., 25, pp 2297–2306, (1989).

It can be shown that the travelling wave equation for the optical power is:

$$\left(\frac{\partial}{\partial z} - \frac{1}{v_g}\frac{\partial}{\partial t}\right)P = [a\Gamma(N - N_t) - \alpha_{sc}]P(z) \qquad (2)$$

where $\alpha_{sc}$ is the waveguide loss per unit length. In the small signal regime, the zero-mean time-varying parts of P and N are denoted by $\delta P$ and $\delta N$ respectively. The carrier density is then given by:

$$\delta N = \frac{-a\Gamma(N - N_t)\delta P/Ah\nu}{i\omega + (1/\tau_c + a\Gamma P_0/Ah\nu)} \qquad (3)$$

For a saturated amplifier, the gain becomes close to the waveguide loss, and the optical power becomes constant at a saturation value. The propagation equation (2) then becomes, ignoring the phase factor:

Integrating this over the length L of the amplifier gives:

$$\frac{\partial}{\partial z}\delta P = -\frac{(a\Gamma)^2(N - N_t)P_0/Ah\nu}{i\omega + (1/\tau_c + a\Gamma P_0/Ah\nu)}\delta P \qquad (4)$$

$$\delta P(L) = T(\omega)\delta P(0)$$

where $T(\omega)$ is a transfer function defines as follows:

$$T(\omega) = \exp - \frac{(a\Gamma)^2(N - N_t)P_0/Ah\nu}{i\omega + (1/\tau_c + a\Gamma P_0/Ah\nu)} L \qquad (5)$$

Writing the stimulated carrier lifetime as:

$$\tau_s = \frac{Ah\nu}{a\Gamma P_0} \quad (6)$$

and writing the optical gains as g=αv(N·N$_r$) it follows that:

$$T(\omega) = \exp - \frac{gL/\tau_s}{i\omega + 1/\tau_c + 1/\tau_s} \quad (7)$$

The analysis for a single input optical beam for the amplifier can be extended by superposition to a situation where two beams of different wavelengths are fed into the amplifier, in order to characterise cross modulation effects. This will now be explained with reference to FIG. 4.

In FIG. 4, two different wavelength input optical beams I, II of respective powers $P_1$ and $P_2$ are shown for optical amplifier A, with the beam I constituting the modulating beam and beam II consisting the target beam.

In FIG. 4A, the situation is considered where each input beam is imparted with a modulation pulse δ so that input pulses δ and δ/τ are applied to the amplifier, as shown. The amplifier is operative so that both inputs are changed in proportion and so the inputs are amplified according to the transfer function T(ω) of the amplifier, which results in outputs δ.T(ω) and δ.T(ω)/τ for the output beams.

In FIG. 4B, a different situation is shown in which the input beams are modulated to produce inputs +δ/τ and −δ/τ respectively. The amplifier is operated so that the input (and output) power is kept constant so that the outputs are the same as the inputs i.e. +δ/τ and −δ/τ.

FIG. 4C shows a superposition of the inputs and outputs of FIGS. 3A and 3B. By considering the relationship between the values of the input and the outputs shown in FIG. 4C and substituting for τ, it can be shown that the cross gain modulation response $T_{XGM}(\omega)$ is given by:

$$T_{XGM}(\omega) = \frac{P_1}{P_1 + P_2}(T(\omega) - 1) \quad (8)$$

The bandwidth of wavelength conversion through cross gain modulation as given by equation (8) is found, in accordance with the invention, to increase almost linearly with amplifier length. The 3 db limit for the bandwidth of this conversion can be understood by further analysis of terms of equation (8). It will be understood that for a given operational condition the term $P_1/P_1+P_2$ is a constant but that the term (T(ω)-1) is variable in both frequency and phase, and has both real and imaginary parts. FIG. 5 shows a plot of the real and imaginary parts of the function F=(T(ω)-1) on orthogonal z and y axes. For increasing frequency, the function F describes a widening spiral 15 beginning at near z=−1 for ω=0, and finishing at z=0 for ω= . Stated differently, the function T(ω) spirals outwardly from the point (−1,0) to the point (0,0). The 3 db wavelength conversion bandwidth limit for function F is described by the locus 16 of a vector of modulus 0.5 centred on the origin and is encountered when the widening spiral 15 crosses the arc 16. By plotting the real and imaginary parts of F for different values of gL, it has been found that when the spiral 15 crosses the arc 16, the phase angle for the expression T(ω) is always close to π/6. Thus by equating the phase of T(ω) in equation (7) to π/6 permits a frequency condition $F_{3db}$ for the 3 db bandwidth to be to be expressed as follows, making the assumption that the amplifier is operating in a saturated condition i.e. the stimulated carrier lifetime $\tau_s$ is smaller than the spontaneous lifetime $\tau_c$:

$$F_{3db} = \frac{3gL}{\pi^2 \tau_s} \quad (9)$$

Thus, it can be seen from equation (9) that the 3 db bandwidth is approximately linearly dependent on to the length L of the amplifier when other factors such as injection current density are maintained constant.

This effect can be seen from the experimental set up that will now be described with reference to FIG. 6. The target wave source 13 comprises a DFB laser operating at 1.555 μm, and the modulated source 14 comprises a tunable laser 14*a* at 1.560 μm, that feeds radiation to a Mach-Zehnder (M-Z) modulator 14*b*. The outputs of both amplifiers are fed through respective erbium doped fibre amplifiers 17, 18 and associated polarisation controllers 19, 20 attenuators 21, 22 and filters 23, 24. The resulting modulated signal and target wave are combined by a 3 db coupler 25 and fed into a first semiconductor amplifier A1 having an active region of length L, which is cascaded to a second semiconductor optical amplifier A2 with an active region, also of length L. The amplifiers are connected in series with optical isolators 26A, 26B, 26C for suppressing ASE. The resulting output is fed through a further filter 27 and an attenuator 28 to a detector diode 29, which feeds an electrical signal through a electrical amplifier 30 to a network analyser 31. The analyser 31 also provides electrical control signals to the modulator 14*b*. The modulator 14*b* was swept through a bit rate of 300 Mhz to 40 GHz. The responses were measured for three different cases: with only the amplifier A1, with only amplifier A2 and also with both amplifiers cascaded. The amplifiers used were both of length L=1.125 mm with a constant width W of the order of 1 micron, and a gain peak at 1.550 μm. The signal and target powers injected into the amplifiers were +2.5 and −1.8 dBm respectively which resulted in the gain being saturated and the Fabry-Perot ripple being reduced to below 0.5 dB. The drive current to each amplifier was set at 140 mA and the single XGM bandwidth was below 10 GHz.

Figure 7:
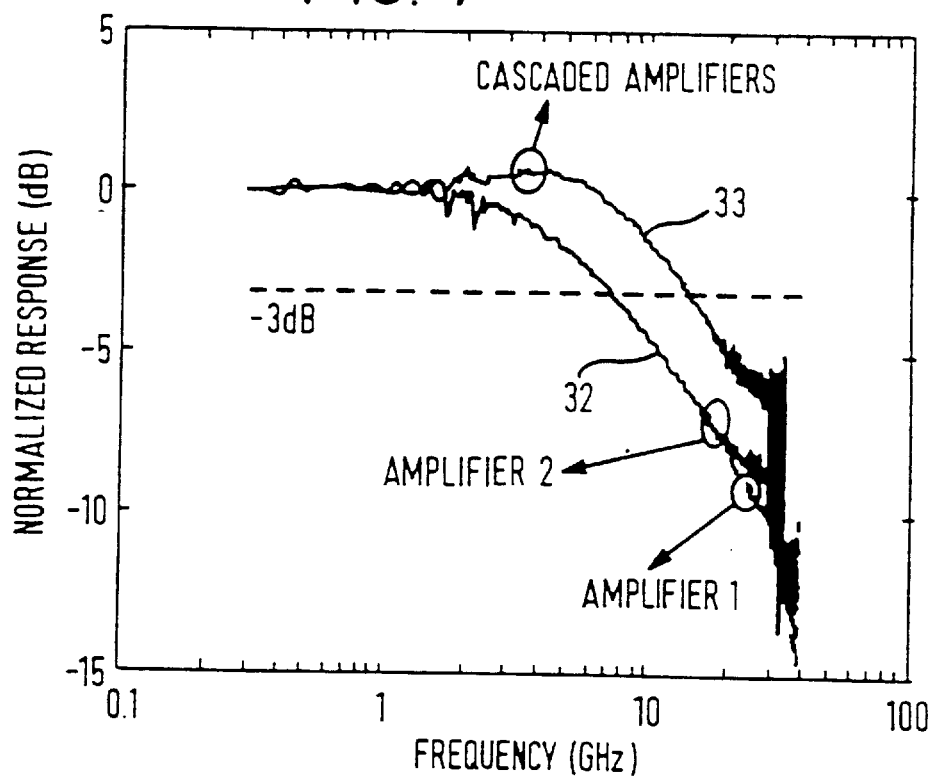
FIG. 7 is a graph of the bandwidth for two amplifiers in cascade and a corresponding one of the amplifiers alone, for a drive current into each amplifier of 140 mA.

The results obtained are shown in FIG. 7. Trace 32 shows the gain of the amplifier as a function of frequency for a single amplifier, whereas trace 33 shows a result for the two amplifiers active regions 1A, 1B cascaded. It can be seen from FIG. 5 the −3 db bandwidth for a single amplifier, of 6.5 GHz is increased to over 13 GHz when two amplifiers are cascaded. This is attributed to the fact that the length L through the cascaded amplifiers is increased, in this example to 2.25 mm by connecting the two amplifiers in series.

Figure 8:
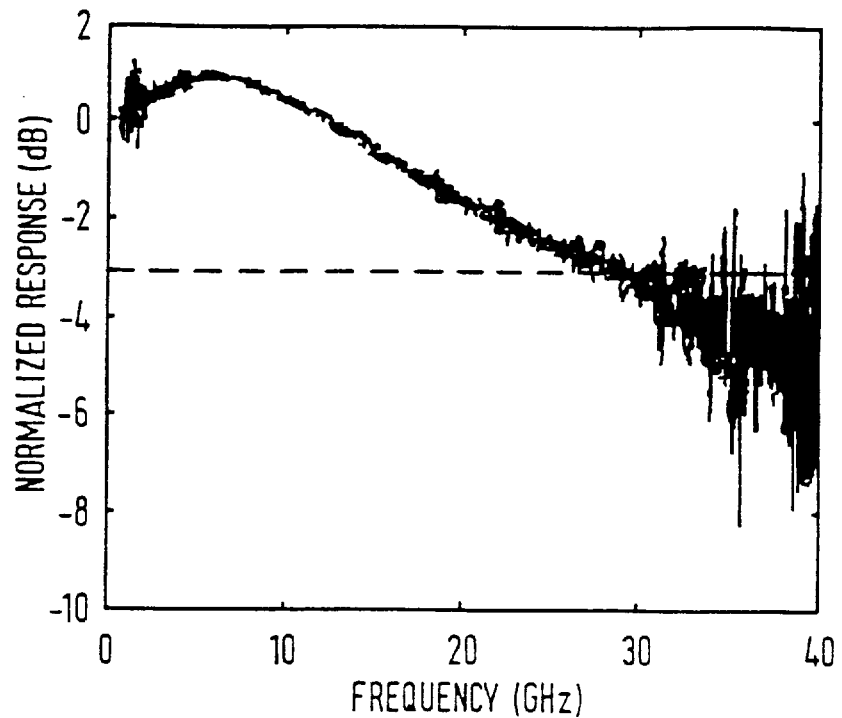
FIG. 8 illustrates the effect of increasing the drive currents to the amplifiers to 400 and 500 mA respectively.

FIG. 8 shows an arrangement in which the cascaded amplifiers have their drive current increased from 140 mA as described above, to 400 and 500 mA respectively. The resulting bandwidth exhibits a −3 db roll off at 28 GHz, substantially greater than hitherto.

It will be appreciated that the cascading of two amplifiers produces substantial losses at the junctions between them and so by forming a single amplifier of length that exceeds 1 mm, a substantially improved bandwidth can be provided, that extends beyond 20 GHz bit modulation rate for amplifier drive currents~400 mA.

Typical examples of the length L of a single semiconductor optical amplifier are in excess of 1.00 mm, 1.125 mm, 1.25 mm, 1.5 mm, 1.75 mm, 2.00 mm, 2.20 mm, 2.25 mm, 2.50 mm or 2.75 mm, with a drive current adjusted to achieve a current density in the active region of typically 50 kA/cm$^2$. The drive current may be adjusted to achieve a −3 db wavelength conversion bandwidth that extends beyond 28 GHz or 35 GHz or 40 GHz. the width W is typically of the order of 1–2 µm, less than 50 µm and usually less than 5 µm Alternatively, a number of devices may be cascaded as described in order to achieve the desired path length, with isolators between them in order to suppress ASE.

In these examples, an amplifier with a MQW structure is used, in which case a path length at least in excess of 1 mm is provided for a channel width W of less than 5 µm. However, as previously explained, bulk devices can alternatively be used, in which case the path length can be shorter, typically in excess of 800 microns, because of the higher efficiency of bulk devices compared with MQW devices.

Figure 9:
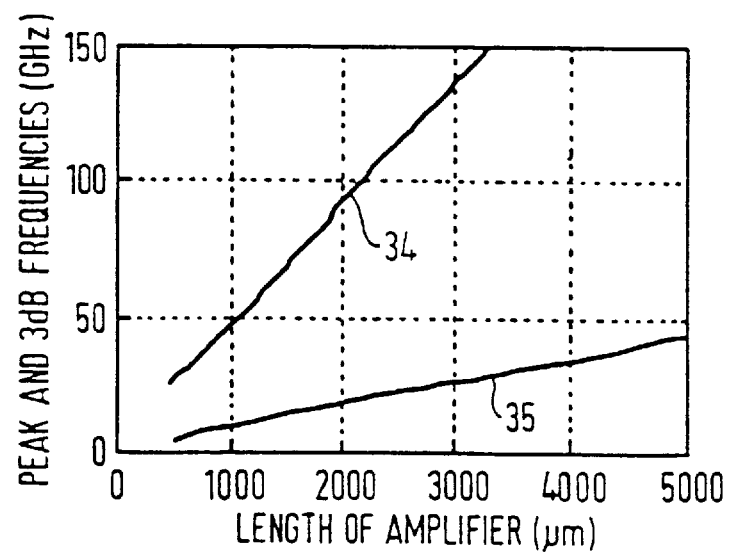
FIG. 9 is a graph illustrating the linearity of the conversion bandwidth with amplifier length L, and also the corresponding linearity of the peak wavelength for the wavelength conversion.

Referring now to FIG. 9, this shows the −3 db bandwidth (plot 34) and peak frequency (plot 35) for the wavelength conversion as a function of amplifier length. It can be seen that both characteristics have a linear relationship with the length of the active region of the amplifier. The amplifiers used to obtain the data were constructed as described with reference to FIGS. 1 and 2 and were of the same construction apart from the length of their active region. They were operated under the same conditions.

A typical practical example of the device may be constructed as described with reference to FIGS. 1 and 2 with an active region 1 of length L=3.5 mm and width W=1–2 µm, with the depth of the layers in the confined active region being of the order of 0.1–0.2 µm. This can be operated with a wavelength conversion bandwidth of the order of 40 Gb/s, with a typical drive current in the range of 500 mA to 2000 mA.

Figure 10:
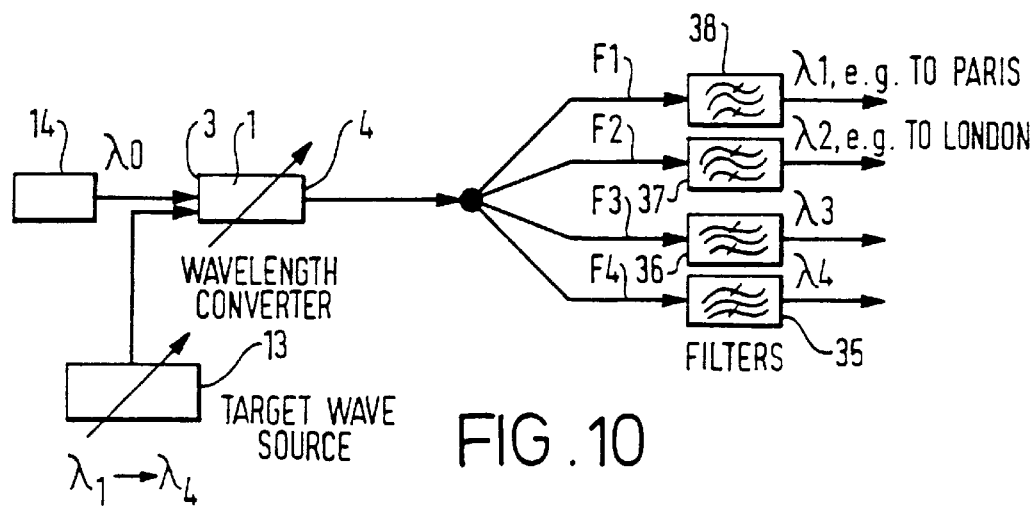
FIG. 10 illustrates a network switch incorporating an amplifier according to the invention.

A practical example of the invention will now be described with reference to FIG. 10. A semiconductor optical amplifier in accordance with the invention, as previously described, is used as a wavelength converter. Optical digital communication signals from a modulated source 14 at wavelength $\lambda_0$ are applied to the converter, which includes an optical amplifier with an active region 1, as previously described, with a length L=3.5 mm. A target wave source 13, which is tunable in terms of wavelength, is also applied to the wavelength converter. A number of output channels are connected to the output 4 of the amplifier, which are typically constructed by optical fibres F1–F4 connected to different geographic destinations. Each fibre has an associated band pass filter 35, 36, 37, 38 tuned to a particular wavelength $\lambda_1$–$\lambda_4$. The target wave source 13 is tunable to the individual wavelengths $\lambda_1$–$\lambda_4$ so that by setting the target wave source wavelength, the modulation from source 14 can be converted to the wavelength of the target wave source and consequently directed to a selected individual one of the communication channels.

Figure 11:
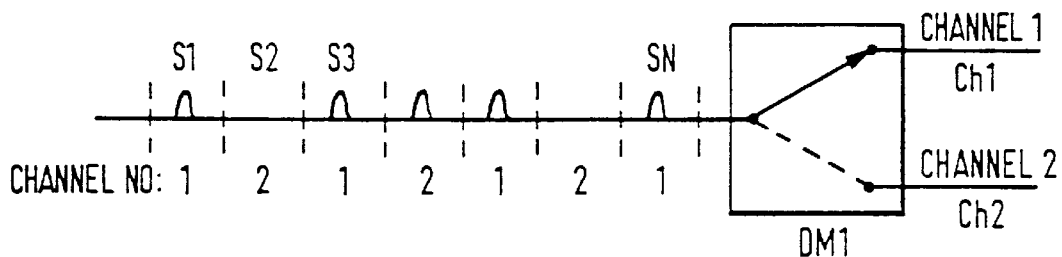
FIG. 11 illustrates schematically a demultiplexer.
Figure 12:
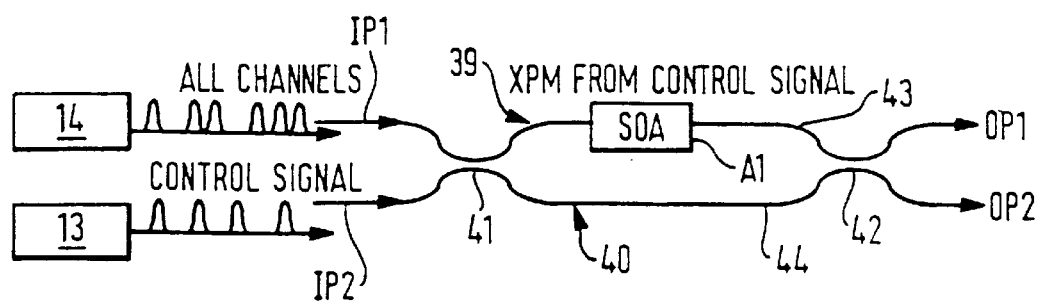
FIG. 12 illustrates how an amplifier according to the invention can be used in a Mach-Zehnder interferometer, configures as a demultiplexer.

An alternative use of an amplifier according to the invention is as a time demultiplexer, in which data configured in interleaved time slots are separated into different channels. Referring to FIG. 11, successive data time slots S1 . . . SN contain data denoted by the presence or absence of optical pulses. The time slots are interleaved and are to be directed to different channels Ch1, Ch2 respectively by demultiplexer DM1. A suitable structure for the demultiplexer DM1 is shown in FIG. 12.

The demultiplexer DM1 comprises a Mach-Zehnder loop structure including first and second optical fibres 39, 40 with two coupling regions 41, 42. As well known in the art, for a Mach-Zehnder loop structure, an optical output is produced at the output OP1 or OP2 depending on the relative phase of the signals travelling in the portions 43, 44 of the fibre loop. In accordance with the invention, an optical amplifier A1, constructed as previously described, with an active region of length >1.25 mm, is connected in one of the loops so as to control the relative phases of signals in the portions 43, 44 of the loop and direct signals to the outputs OP1, OP2 selectively.

The interleaved optical data stream for both Channels 1 and 2 from source 14 is fed to input IP1, whereas a control optical pulse stream is fed to the input IP2 from source 13. The control pulse stream includes pulses which delineate in time, data slots for Channel 1. The signal streams fed to the inputs IP1,2 are of respective different wavelengths or polarisations, to both and are mixed together by the coupler so that the mixed stream travels along both fibre portions 43, 44. The amplifiers A1 produces a phase shift in the signal stream travelling in fibre portion 43 relative to portion 44 as a result of cross phase modulation that occurs in the amplifier during the occurrence of the control pulses that occur for the data slots from Channel 1, and as a result, optical data pulses for Channel 1 are directed selectively to OP1 whereas data pulses for Channel 2 pass to output OP2. It will be understood that either Channel 1 or 2 may itself include a plurality of further channels that can be separated by means of additional demultiplexers.

Whilst the described Mach-Zehnder device has been described for use as a demultiplexer, it can also be used as a switch for other applications e.g. for routing packets in packet switched networks, for gating signals for other purposes and for improving the extinction ratio of a digitally modulated optical signal.

Alternative Mach-Zehnder loop structures will now be described, that incorporate optical amplifiers A1, A2 in both of the portions 43, 44 of the fibre loop, with both of the amplifiers being constructed as previously described e.g. each with an active region of a length greater than 1.75 mm.

In FIG. 13, the optical path length from the splitter 41 to each of the amplifiers A1, A2 differ by an offset d. Thus, considering the inputs IP1 and IP2, the input signals reach the amplifier A1 before the amplifier A2, with the result that a very narrow switching window is produced, useful for demultiplexing. The use of amplifiers A1, A2 in accordance with the invention, sharpens the definition of the switching window and so enables shorter switching windows to be achieved than hitherto. In this configuration, the width of the switching window is fixed by the spatial offset d, during the fabrication process for the device.

Referring to FIG. 14, an alternative configuration is shown in which the amplifiers A1 and A2 are disposed symmetrically in the interferometer but the control signal IP2 is fed into the portion 43 of the loop through a separate coupler 46 so that for example, demultiplexing can be carried out in the manner described with reference to FIG. 12. However, the presence of the symmetrical disposition of the amplifiers A1, A2 enables matching of losses in both portions 43, 44 of the fibre loop. The use of the longer amplifiers A1, A2 in accordance with the invention enables the phase changes that occur in amplifier A1 to be speeded up as compared with the prior art.

Figure 15:
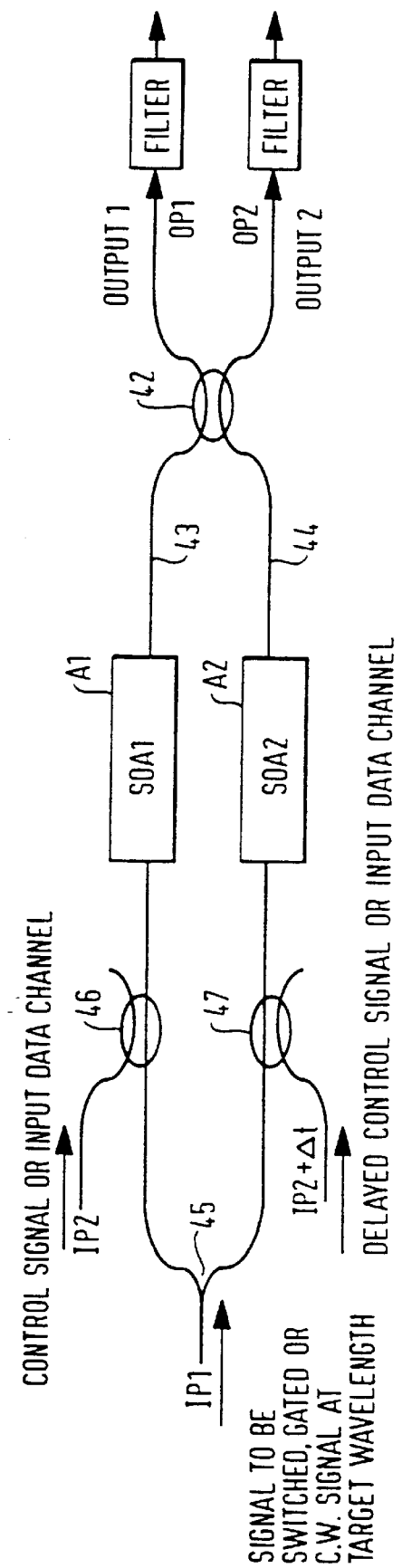

In FIG. 15, the amplifiers A1, A2 are disposed symmetrically in the interferometer and control signals can be injected into the amplifier inputs individually through respective optical couplers 46, 47. In the example shown, the input IP2 is fed into both of the couplers 46, 47, with the input to coupler 47 being delayed in time relative to the input for coupler 46. As a result, a very narrow switching window is produced in the manner described with reference to FIG. 13. The use of amplifiers in accordance with the invention can sharpen the switching window. In the configuration of FIG. 15, the delay between the two injected control signals IP2, IP2+Δ can be varied so as to adjust the length of the switching window.

The invention also has application to semiconductor optical amplifiers which are used in modulators that operate by four wave mixing. It has been found according to the invention that by increasing the length of the amplifier, the efficiency of four wave mixing is improved and the signal to noise ratio is increased. This will now be explained by way of example with reference to FIGS. 6 and 16. The apparatus of FIG. 6 was driven such that the target wave source 13 operated at relatively high power and provided a pump for the amplifiers A1, A2, and a pumping wavelength $\lambda_1=\lambda_p=1.555$ μm. The tunable laser 14a was operated at a wavelength of $\lambda_2=\lambda_i=1.560$ μm. The outputs of the lasers were applied with the same polarisation to the amplifiers A1, A2. The amplitude of the output of laser 14a was significantly lower than that of laser 13 with the result that four wave mixing occurred as can be seen from FIG. 16. A wavelength converted signal $\lambda_c$ was produced. The wavelength relationship between the signals is as follows:

$$\lambda_c = 2\lambda_p - \lambda_i.$$

Figure 16:
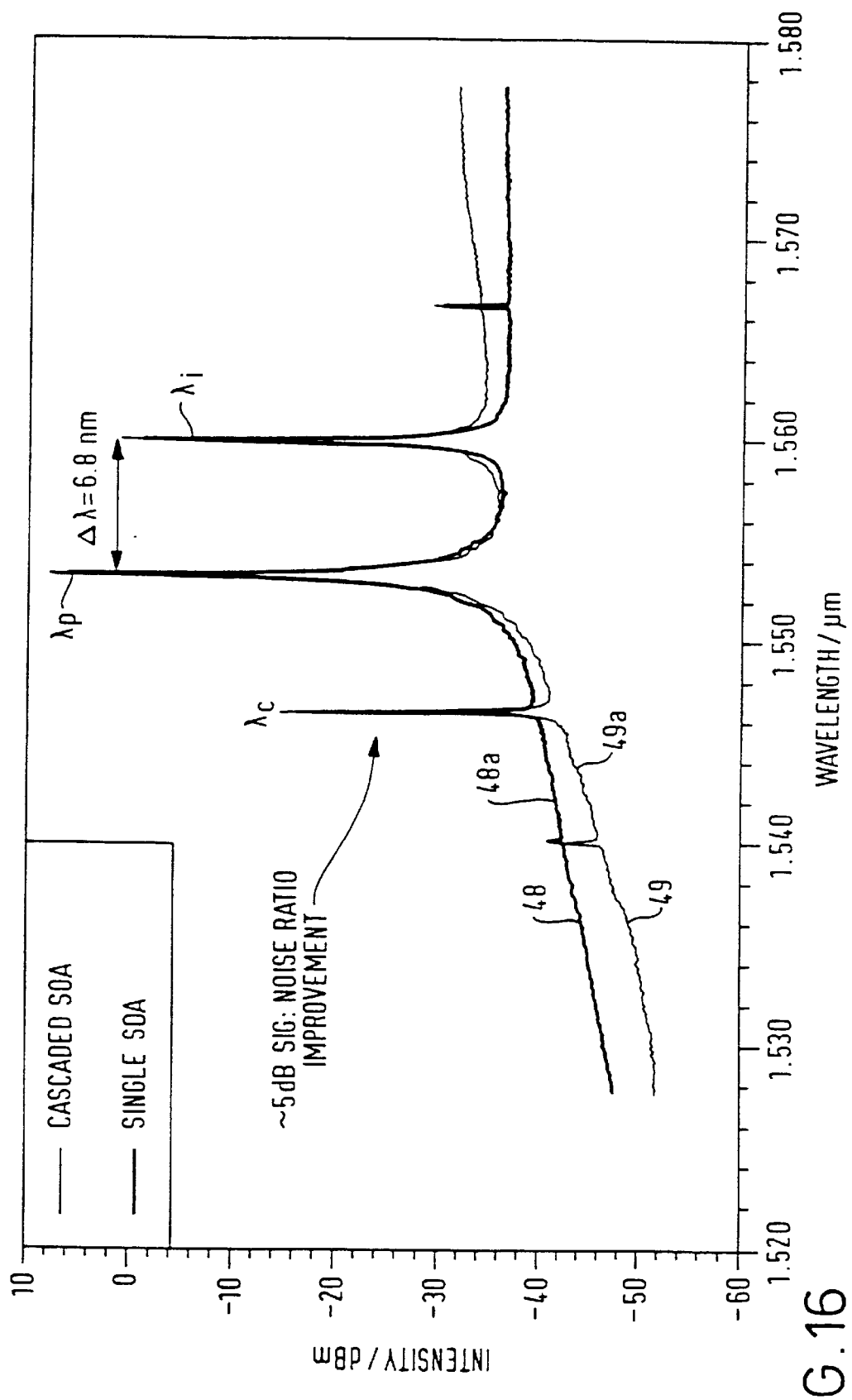
FIG. 16 illustrates the results for the apparatus of FIG. 6, when operated by four wave mixing.

Thus, the converted signal and the input signal are equally spaced in terms of wavelength on opposite sides of the pump wavelength $\lambda_p$ as shown in FIG. 16.

A non-limiting, qualitative explanation of the four wave mixing process will now be given. Due to the fact that $\lambda_p$ and $\lambda_i$ are of the same polarisation, they form a beat frequency of the order of 100 GHz which causes the carrier density in the amplifier to oscillate. This produces a non-linear effect in respect of the gain, which produces further beating with the pump wavelength so as to produce the wavelength converted signal $\lambda_c$. For further details, reference is directed to Stubjkaer et al supra.

Figure 6:
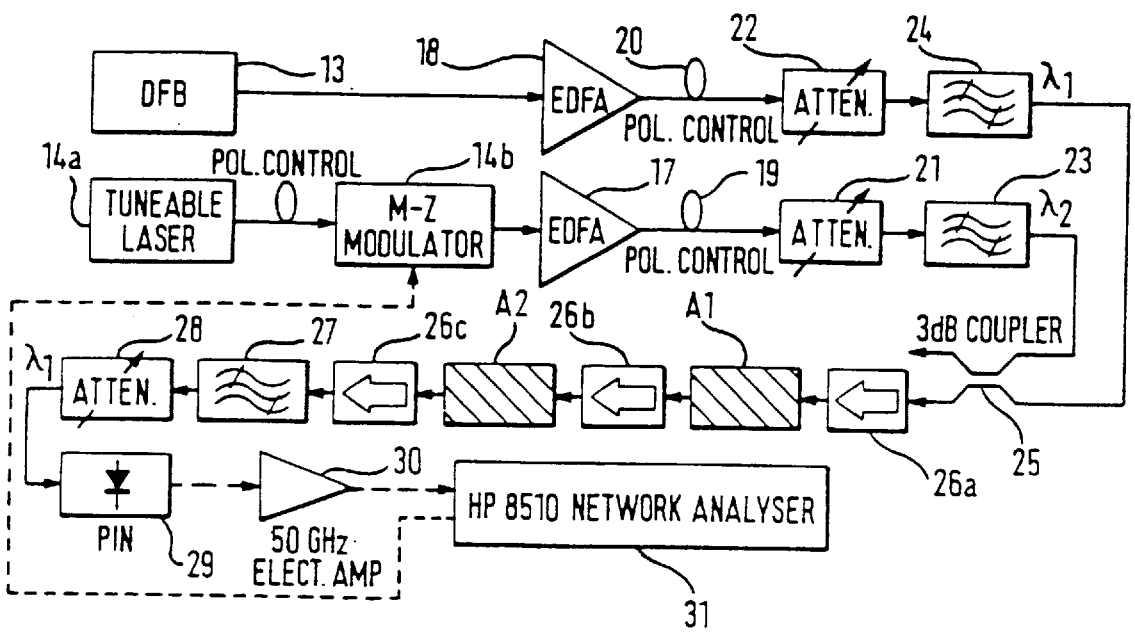
FIG. 6 is a schematic diagram of an experimental set-up for testing the bandwidth dependence upon path length for the amplifier.

The effect of operating the apparatus of FIG. 6 with only one of the amplifiers A1, A2, and then with both of the amplifiers is shown by a thick trace 48 and a thin trace 49 respectively. It will be seen that the four wave mixing conversion efficiency improves with increased amplifier length L. amplitude of the converted signal $\lambda_c$ increases. Also, the signal to noise ratio is improved. It will be seen that the noise floor 48a of trace 49 is suppressed downwardly as compared with corresponding floor 48 a when a single amplifier is used so that the signal to noise ratio is increased, in respect of the converted signal $\lambda_c$. It is to be noted that the suppression of the noise floor occurs asymmetrically, and the wavelength converted signal $\lambda_c$ is positioned on the appropriate side of the pump wavelength $\lambda_p$ to take advantage of the asymmetrical, downward changes that occur to the noise floor.

As previously mentioned, four wave mixing has the advantage that the wavelength conversion occurs rapidly as compared with cross gain modulation. The converted signal $\lambda_c$ can be imparted with a modulation, by modulating the input signal $\lambda_i$. This can be achieved in the configuration of FIG. 6 by operating the modulator 14b.

An amplifier that uses four wave mixing, can be used to correct dispersion in a signal travelling along an optical communication path e.g. a signal travelling over long distances. The signal travelling along the path may be subject to a frequency shift due to the dispersive effects of the path e.g. an optical fibre. An amplifier which operates by four wave mixing can be used to change the wavelength of the input signal $\lambda_i$ to $\lambda_c$ to achieve an inversion of the signal wavelength relative to $\lambda_p$, so as to compensate for chirp.

It has been found that for four wave mixing, the efficiency of the amplifier is approximately proportional to the square of its path length i.e. $E \cong L^2$.

We claim:

1. Semiconductor optical amplifier apparatus including:
   an optical path from an input to an output through an optical amplification region of a substantially constant width less than 50 μm along its length,
   wherein the path has a length through the region that exceeds 1 mm.

2. Optical apparatus comprising:
   a target wave source,
   a modulated optical source that is modulated at a given bit rate, and
   an optical amplifier to receive radiation from the sources and operative to produce modulation of the target wave according to the modulation of the modulated optical source whereby to produce a modulated target wave output,
   the amplifier having an optical path from an input to an output through an optical amplification region wherein the length of the path is selected to be longer than that at which optical gain saturation due to ASE in said region occurs.

3. Apparatus as in claim 2 wherein the region includes a MQW structure and the path length exceeds 1 mm.

4. Apparatus as in claim 2 wherein the path includes bulk material and the path length exceeds 800 μm.

5. Apparatus as in claim 3 wherein the amplifier has a width that is less than 50 μm along its length.

6. Apparatus as in claim 2, wherein the length of the path is selected so that the gain of the amplifier for the modulated target wave output exhibits a −3 db bandwidth that extends beyond 20 GHz in respect of the modulation bit rate.

7. Apparatus as in claim 2 wherein the gain of the amplifier exhibits a −3 db bandwidth that extends beyond 28 GHz in respect of the modulation bit rate.

8. Apparatus as in claim 2 wherein the gain of the amplifier exhibits a −3 db bandwidth that extends beyond 35 GHz in respect of the modulation bit rate.

9. Apparatus as in claim 2 wherein the gain of the amplifier exhibits a −3 db bandwidth that extends beyond 40 GHz in respect of the modulation bit rate.

10. Apparatus as in claim 2 wherein the radiation from the modulated optical source produces cross gain modulation of the radiation from the target wave source.

11. Apparatus as in claim 2 wherein the radiation from the source interacts in the optical amplification region whereby radiation from the target wave source is phase modulated by the modulated radiation from the modulated source whereby to produce cross phase modulation.

12. Apparatus as in claim 11 including phase responsive means for comparing the phase of the modulated target wave output with the phase of the modulated optical source.

13. Apparatus as in claim 2 wherein the target source has a first wavelength characteristic and the modulated optical source has a second different wavelength characteristic, whereby to produce wavelength conversion.

14. Apparatus as in claim 13 including:
   a plurality of optical output channels coupled to the optical amplifier,
   a plurality of optical filtering means associated with the channels respectively and each having a respective different pass characteristic, and
   means for controlling the wavelength of the target wave source whereby to direct the modulated output to the channels selectively.

15. Optical modulation apparatus comprising:
a semiconductor optical amplifier that includes an optical path from an input to an output through an optical amplification region,
first and second sources of different input optical radiation for the amplifier, whereby the amplifier produces an amplified optical output in dependence upon the optical radiation from the first and second source; and
wherein the path has a length through the region that exceeds 1 mm and has a substantially constant width less than 50 µm along the length.

16. Apparatus as in claim 15 wherein:
the first source comprises a source of pumping radiation of a first wavelength ($\lambda_p$),
the second source is of a second different wavelength ($\lambda_i$), and
the amplifier is operative to produce said output at a wavelength ($\lambda_c$) different from the first and second wavelengths by four wave mixing.

17. Apparatus as in claim 1 wherein the amplifier has a path length that is less than 5 µm.

18. Apparatus as in claim 1 wherein the amplifier has a path length that exceeds 1.125 or 1.25 or 1.5 or 1.75 or 2.00 or 2.25 or 2.50 or 2.75 or 3.00 mm.

19. Apparatus as in claim 1 wherein the amplifier includes:
an active region, and
means for applying an electric current to the active region to produce amplification therein.

20. Apparatus as in claim 19 including means for applying a current of not more than 400 mA to the amplifier.

21. Apparatus as in claim 19 wherein the active region comprises a buried heterostructure on a substrate.

22. Apparatus as in claim 20 wherein the active region comprises a multiple quantum well structure.

23. Apparatus as in claim 20, wherein the active region comprises a stack of InGaAsP-InP layers disposed between a layer of InP of a first conductivity type and a region of InP of a second conductivity type.

24. Apparatus as in claim 1 wherein the amplifier comprises at least first and second amplifier elements connected in cascade, the aggregate length of the paths through the optical amplification regions thereof exceeding 1 mm.

25. Apparatus as in claim 2, wherein:
the modulated optical source is operative to provide an optical bit stream for interleaved time slots for first and second channels,
the target source is operative to provide a bit stream which selectively defines time slots for one of the channels,
the amplifier producing a selective phase shift for data bits in one of the channels, and including:
phase sensitive means for comparing the phase of data bits output by the amplifier with a reference for directing the data bits selectively to the different channels.

26. Apparatus as in claim 25 including:
coupling means for mixing the bit streams from said sources and feeding the resulting mixed stream on a first path to the amplifier and a second path to the phase sensitive means.

27. Use of an optical modulation apparatus comprising a semiconductor optical amplifier that includes:
an optical path from an input to an output through an optical amplification region of a substantially constant width less than 50 µm along its length, and
first and second sources of different input optical radiation for the amplifier, to produce an amplified optical output in dependence upon the optical radiation from the first and second sources wherein the path has a length through the region that exceeds 1 mm.

28. Use of an optical modulation apparatus as in claim 27 wherein the amplifier operates by cross gain modulation or cross phase modulation or four wave mixing.

29. Semiconductor optical amplifier apparatus including:
an optical path from an input to an output through an optical amplification region wherein the path has a length through the region that exceeds 3 mm, and a substantially constant width in said amplification region of less than 50 µm.

30. A Mach-Zehnder interferometer including at least one amplifier apparatus as in claim 1.

* * * * *